(12) United States Patent
Yaniv et al.

(10) Patent No.: US 9,131,610 B2
(45) Date of Patent: *Sep. 8, 2015

(54) BUFFER LAYER FOR SINTERING

(71) Applicants: APPLIED NANOTECH HOLDINGS, INC., Austin, TX (US); ISHIHARA CHEMICAL CO., LTD., Hyogo-ku, Hyogo (JP)

(72) Inventors: Zvi Yaniv, Austin, TX (US); Mohshi Yang, Austin, TX (US); Peter B. Laxton, Alameda, CA (US)

(73) Assignees: PEN Inc., Deerfield Beach, FL (US); Ishihara Chemical Co., Ltd., Hyogo-Ku, Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/073,986

(22) Filed: Nov. 7, 2013

(65) Prior Publication Data

US 2014/0057428 A1    Feb. 27, 2014

Related U.S. Application Data

(63) Continuation of application No. 13/260,893, filed as application No. PCT/US2010/028811 on Mar. 26, 2010, now Pat. No. 8,647,979.

(60) Provisional application No. 61/174,758, filed on May 1, 2009, provisional application No. 61/163,894, filed on Mar. 27, 2009.

(51) Int. Cl.
*H01L 23/48*   (2006.01)
*H05K 1/09*    (2006.01)
(Continued)

(52) U.S. Cl.
CPC ............... *H05K 1/092* (2013.01); *B22F 3/105* (2013.01); *B22F 7/04* (2013.01); *B23K 26/3266* (2013.01);
(Continued)

(58) Field of Classification Search
CPC .......................................................... H01L 23/48
USPC ................................. 438/637, 151; 257/774
See application file for complete search history.

(56) References Cited

U.S. PATENT DOCUMENTS 3,239,597 A    3/1966 Flynn
3,580,731 A    5/1971 Milewski et al.
(Continued)

FOREIGN PATENT DOCUMENTS

CN    1509206 A    6/2004
CN    1803940      7/2006
(Continued)

OTHER PUBLICATIONS

Schroder et al., "Broadcast Photonic Curing of Metallic Nanoparticle Films," Nanotechnologies, Inc. publication, 2006 NSTI Nanotechnology Conference and Trade Show, May 7-11, 2006, 4 pages.
(Continued)

*Primary Examiner* — Marc Armand
(74) *Attorney, Agent, or Firm* — Kelly Kordzik; Matheson Keys & Kordzik PLLC

(57) ABSTRACT

A layer of material having a low thermal conductivity is coated over a substrate. A film of conductive ink is then coated over the layer of material having the low thermal conductivity, and then sintered. The film of conductive ink does not absorb as much energy from the sintering as the film of conductive ink coated over the layer of material having the low thermal conductivity. The layer of material having the low thermal conductivity may be a polymer, such as polyimide.

20 Claims, 10 Drawing Sheets

(51) Int. Cl.

| | | |
|---|---|---|
| *B22F 3/105* | (2006.01) | |
| *B22F 7/04* | (2006.01) | |
| *B23K 26/34* | (2014.01) | |
| *H01L 21/268* | (2006.01) | |
| *H01L 21/48* | (2006.01) | |
| *H05K 3/46* | (2006.01) | |
| *H01L 21/288* | (2006.01) | |
| *H01L 23/532* | (2006.01) | |
| *H05K 1/02* | (2006.01) | |
| *H05K 3/10* | (2006.01) | |
| *B23K 26/32* | (2014.01) | |
| *B23K 35/02* | (2006.01) | |
| *H01L 21/768* | (2006.01) | |
| *H05K 3/12* | (2006.01) | |

(52) U.S. Cl.
 CPC ............. *B23K 26/3273* (2013.01); *B23K 26/34*
 (2013.01); *B23K 35/0244* (2013.01); *H01L*
 *21/268* (2013.01); *H01L 21/288* (2013.01);
 *H01L 21/4867* (2013.01); *H01L 21/76877*
 (2013.01); *H01L 23/5328* (2013.01); *H05K*
 *1/0201* (2013.01); *H05K 3/10* (2013.01); *H05K*
 *3/1283* (2013.01); *H05K 3/4664* (2013.01);
 *B22F 2998/00* (2013.01); *B23K 2201/36*
 (2013.01); *H05K 3/125* (2013.01); *H05K*
 *2201/062* (2013.01); *H05K 2203/107* (2013.01);
 *Y10T 29/49156* (2015.01)

(56) References Cited

U.S. PATENT DOCUMENTS

| | | | |
|---|---|---|---|
| 3,796,598 A | 3/1974 | Gejyo et al. | |
| 3,950,605 A | 4/1976 | Hori et al. | |
| 4,093,466 A | 6/1978 | Davis | |
| 4,151,008 A | 4/1979 | Kirkpatrick | |
| 4,194,913 A | 3/1980 | Davis | |
| RE30,434 E | 11/1980 | Davis | |
| 4,234,631 A | 11/1980 | Davis | |
| 4,331,518 A | 5/1982 | Wilson | |
| 4,591,951 A | 5/1986 | Iwamoto et al. | |
| 4,640,746 A | 2/1987 | Nobel et al. | |
| 4,681,670 A | 7/1987 | Nobel et al. | |
| 4,749,626 A | 6/1988 | Kadija et al. | |
| 4,756,791 A | 7/1988 | D'Angelo et al. | |
| 4,922,322 A | 5/1990 | Mathew | |
| 4,935,312 A | 6/1990 | Nakayama et al. | |
| 4,959,278 A | 9/1990 | Shimauch et al. | |
| 4,997,516 A | 3/1991 | Adler | |
| 4,997,722 A | 3/1991 | Adler | |
| 5,008,997 A | 4/1991 | Phy | |
| 5,039,576 A | 8/1991 | Wilson | |
| 5,049,718 A | 9/1991 | Spletter et al. | |
| 5,130,275 A | 7/1992 | Dion | |
| 5,160,422 A | 11/1992 | Nishimura et al. | |
| 5,202,179 A | 4/1993 | Kasahara | |
| 5,234,513 A | 8/1993 | Inoue et al. | |
| 5,260,849 A | 11/1993 | Kasahara | |
| 5,277,756 A | 1/1994 | Dion | |
| 5,320,737 A | 6/1994 | Chao et al. | |
| 5,322,823 A | 6/1994 | Ueda et al. | |
| 5,384,204 A | 1/1995 | Yumoto et al. | |
| 5,393,573 A | 2/1995 | MacKay | |
| 5,439,639 A | 8/1995 | Vianco et al. | |
| 5,492,595 A | 2/1996 | Carano et al. | |
| 5,698,087 A | 12/1997 | Bokisa | |
| 5,724,727 A | 3/1998 | Chopra et al. | |
| 5,730,851 A | 3/1998 | Arrowsmith et al. | |
| 5,750,017 A | 5/1998 | Zhang | |
| 5,798,286 A | 8/1998 | Faraci et al. | |
| 5,807,519 A | 9/1998 | Suzuki et al. | |
| 5,861,076 A | 1/1999 | Adlam | |
| 5,879,568 A | 3/1999 | Urasaki et al. | |
| 5,889,083 A | 3/1999 | Zhu et al. | |
| 5,990,197 A | 11/1999 | Escano et al. | |
| 6,010,771 A | 1/2000 | Isen et al. | |
| 6,093,503 A | 7/2000 | Isoyama et al. | |
| 6,099,713 A | 8/2000 | Yanada et al. | |
| 6,139,777 A | 10/2000 | Omoya et al. | |
| 6,147,400 A | 11/2000 | Faraci et al. | |
| 6,165,386 A | 12/2000 | Endo et al. | |
| 6,200,732 B1 | 3/2001 | Tamura et al. | |
| 6,238,847 B1 | 5/2001 | Axtell et al. | |
| 6,248,455 B1 | 6/2001 | Adams et al. | |
| 6,297,142 B1 | 10/2001 | Mita et al. | |
| 6,306,947 B1 | 10/2001 | Morishima et al. | |
| 6,361,823 B1 | 3/2002 | Bokisa et al. | |
| 6,426,548 B1 | 7/2002 | Mita et al. | |
| 6,433,409 B2 | 8/2002 | Mita et al. | |
| 6,472,459 B2 | 10/2002 | Morales et al. | |
| 6,530,944 B2 | 3/2003 | West et al. | |
| 6,554,914 B1 | 4/2003 | Rozbicki et al. | |
| 6,583,500 B1 | 6/2003 | Abbott et al. | |
| 6,603,205 B2 | 8/2003 | Miura | |
| 6,638,847 B1 | 10/2003 | Cheung et al. | |
| 6,646,330 B2 | 11/2003 | Kubara et al. | |
| 6,651,521 B2 | 11/2003 | Carbone et al. | |
| 6,664,492 B1 | 12/2003 | Babb et al. | |
| 6,679,937 B1 | 1/2004 | Kodas et al. | |
| 6,682,584 B2 | 1/2004 | Pozarnsky et al. | |
| 6,720,499 B2 | 4/2004 | Bokisa et al. | |
| 6,773,827 B2 | 8/2004 | Higuchi | |
| 6,773,828 B1 | 8/2004 | Ooi et al. | |
| 6,774,036 B2 | 8/2004 | Goldstein | |
| 6,783,569 B2 | 8/2004 | Cheon et al. | |
| 6,828,660 B2 | 12/2004 | Abbott | |
| 6,860,981 B2 | 3/2005 | Schetty, III et al. | |
| 6,899,775 B2 | 5/2005 | Hill et al. | |
| 6,917,098 B1 | 7/2005 | Yamunan | |
| 6,951,666 B2 | 10/2005 | Kodas et al. | |
| 7,019,391 B2 | 3/2006 | Tran | |
| 7,062,848 B2 | 6/2006 | Pan et al. | |
| 7,084,067 B2 | 8/2006 | Geusic et al. | |
| 7,087,523 B2 | 8/2006 | Grigoropoulos et al. | |
| 7,153,775 B2 | 12/2006 | Geusic | |
| 7,160,629 B2 | 1/2007 | Crosby | |
| 7,179,362 B2 | 2/2007 | Dietterle et al. | |
| 7,195,702 B2 | 3/2007 | Bokisa, Sr. et al. | |
| 7,215,014 B2 | 5/2007 | Su et al. | |
| 7,252,699 B2 | 8/2007 | Perry et al. | |
| 7,262,603 B1 | 8/2007 | Benton et al. | |
| 7,294,366 B2 | 11/2007 | Renn et al. | |
| 7,297,902 B2 | 11/2007 | Weiss | |
| 7,316,725 B2 | 1/2008 | Kodas et al. | |
| 7,351,667 B2 | 4/2008 | Hwang et al. | |
| 7,357,681 B2 | 4/2008 | Yamagami et al. | |
| 7,384,862 B2 * | 6/2008 | Yamazaki | 438/610 |
| 7,391,116 B2 | 6/2008 | Chen et al. | |
| 7,482,540 B2 | 1/2009 | Shukushima et al. | |
| 7,507,618 B2 | 3/2009 | Dunbar | |
| 7,514,369 B2 | 4/2009 | Li et al. | |
| 7,547,479 B2 | 6/2009 | Wessling | |
| 7,776,196 B2 | 8/2010 | Fujimoto et al. | |
| 7,786,024 B2 | 8/2010 | Stumbo et al. | |
| 7,867,413 B2 | 1/2011 | Lee et al. | |
| 7,879,131 B2 | 2/2011 | Yaniv et al. | |
| 8,647,979 B2 * | 2/2014 | Yaniv et al. | 438/637 |
| 2002/0148386 A1 | 10/2002 | Woosman et al. | |
| 2002/0158342 A1 | 10/2002 | Tuominen et al. | |
| 2002/0185716 A1 | 12/2002 | Abys et al. | |
| 2002/0187364 A1 | 12/2002 | Heber et al. | |
| 2002/0192492 A1 | 12/2002 | Abys | |
| 2003/0025182 A1 | 2/2003 | Abys et al. | |
| 2003/0151030 A1 | 8/2003 | Gurin | |
| 2003/0168639 A1 | 9/2003 | Cheon et al. | |
| 2003/0213614 A1 | 11/2003 | Furusawa | |
| 2003/0226758 A1 | 12/2003 | Egli | |
| 2004/0026256 A1 | 2/2004 | Lindgren | |
| 2004/0026684 A1 | 2/2004 | Empedocies | |
| 2004/0118696 A1 | 6/2004 | Zhang et al. | |
| 2004/0131934 A1 | 7/2004 | Sugnaux et al. | |
| 2004/0132299 A1 | 7/2004 | Matsuda et al. | |

(56) References Cited

U.S. PATENT DOCUMENTS

| | | |
|---|---|---|
| 2004/0134379 A1 | 7/2004 | Wong et al. |
| 2004/0147113 A1 | 7/2004 | Yamazaki et al. |
| 2004/0147618 A1 | 7/2004 | Lee et al. |
| 2004/0171211 A1 | 9/2004 | Lee et al. |
| 2004/0175631 A1 | 9/2004 | Crocker et al. |
| 2004/0192042 A1 | 9/2004 | Sirringhaus et al. |
| 2004/0218136 A1 | 11/2004 | Imai et al. |
| 2004/0232000 A1 | 11/2004 | Crosby |
| 2004/0241532 A1 | 12/2004 | Kim |
| 2004/0256239 A1 | 12/2004 | Whitlaw et al. |
| 2005/0019543 A1 | 1/2005 | Lyles |
| 2005/0026423 A1 | 2/2005 | Yamazaki |
| 2005/0078158 A1 | 4/2005 | Magdassi et al. |
| 2005/0097987 A1 | 5/2005 | Kodas et al. |
| 2005/0145502 A1 | 7/2005 | Schetty, III et al. |
| 2005/0148164 A1 | 7/2005 | Casey et al. |
| 2005/0183768 A1 | 8/2005 | Roscheisen et al. |
| 2005/0218398 A1 | 10/2005 | Tran |
| 2005/0230042 A1 | 10/2005 | Hasimoto |
| 2005/0249967 A1 | 11/2005 | Egli |
| 2005/0249968 A1 | 11/2005 | Xu et al. |
| 2005/0249969 A1 | 11/2005 | Xu et al. |
| 2005/0274480 A1 | 12/2005 | Barsoum et al. |
| 2006/0001726 A1 | 1/2006 | Kodas et al. |
| 2006/0011267 A1 | 1/2006 | Kay et al. |
| 2006/0054668 A1 | 3/2006 | Severin |
| 2006/0057502 A1 | 3/2006 | Okada et al. |
| 2006/0062701 A1 | 3/2006 | Nakamura et al. |
| 2006/0068218 A1 | 3/2006 | Hooghan |
| 2006/0073680 A1 | 4/2006 | Han et al. |
| 2006/0082952 A1 | 4/2006 | Ogiwara |
| 2006/0090819 A1 | 5/2006 | Egli |
| 2006/0091121 A1 | 5/2006 | Zanolli et al. |
| 2006/0096867 A1 | 5/2006 | Bokisa et al. |
| 2006/0110424 A1 | 5/2006 | Lyles |
| 2006/0111467 A1 | 5/2006 | Reinhardt et al. |
| 2006/0116000 A1 | 6/2006 | Yamamoto |
| 2006/0141268 A1 | 6/2006 | Kalkan et al. |
| 2006/0159838 A1 | 7/2006 | Kowalski et al. |
| 2006/0163743 A1 | 7/2006 | Kuwabara et al. |
| 2006/0163744 A1 | 7/2006 | Vanheusden et al. |
| 2006/0183055 A1 | 8/2006 | O'Neill et al. |
| 2006/0189113 A1 | 8/2006 | Vanheusden et al. |
| 2006/0234519 A1 | 10/2006 | Pan et al. |
| 2006/0240591 A1 | 10/2006 | Grier et al. |
| 2006/0286301 A1 | 12/2006 | Murata et al. |
| 2007/0007144 A1 | 1/2007 | Schetty, III |
| 2007/0040191 A1 | 2/2007 | Bezryadin et al. |
| 2007/0051927 A1 | 3/2007 | Itoh et al. |
| 2007/0074316 A1 | 3/2007 | Alden et al. |
| 2007/0095879 A1 | 5/2007 | Holmes |
| 2007/0105395 A1 | 5/2007 | Kinzel et al. |
| 2007/0117475 A1 | 5/2007 | Tu |
| 2007/0144305 A1 | 6/2007 | Jablonski et al. |
| 2007/0145375 A1 | 6/2007 | Cho |
| 2007/0148972 A1 | 6/2007 | Hara et al. |
| 2007/0158204 A1 | 7/2007 | Taylor et al. |
| 2007/0163643 A1 | 7/2007 | Van Duren |
| 2007/0166453 A1 | 7/2007 | Van Duren et al. |
| 2007/0175296 A1 | 8/2007 | Subramanian et al. |
| 2007/0176991 A1 | 8/2007 | Arai et al. |
| 2007/0190326 A1 | 8/2007 | Perry et al. |
| 2007/0218312 A1 | 9/2007 | Sakuyama et al. |
| 2007/0275262 A1 | 11/2007 | Lin et al. |
| 2007/0281136 A1 | 12/2007 | Hampden-Smith et al. |
| 2007/0281249 A1 | 12/2007 | Tutt et al. |
| 2007/0284700 A1 | 12/2007 | Jackson et al. |
| 2007/0287022 A1 | 12/2007 | Jackson et al. |
| 2007/0287023 A1 | 12/2007 | Jackson et al. |
| 2007/0287024 A1 | 12/2007 | Jackson et al. |
| 2007/0289483 A1 | 12/2007 | Cho et al. |
| 2007/0295530 A1 | 12/2007 | Jackson et al. |
| 2008/0020208 A1 | 1/2008 | Lee et al. |
| 2008/0020304 A1 | 1/2008 | Schroder et al. |
| 2008/0075934 A1 | 3/2008 | Barlow et al. |
| 2008/0083950 A1 | 4/2008 | Pan et al. |
| 2008/0143906 A1 | 6/2008 | Allemand et al. |
| 2008/0164557 A1 | 7/2008 | Kim et al. |
| 2008/0169122 A1 | 7/2008 | Shiraishi et al. |
| 2008/0193667 A1 | 8/2008 | Garbar et al. |
| 2008/0241391 A1 | 10/2008 | Kim et al. |
| 2008/0241414 A1 | 10/2008 | Kim et al. |
| 2008/0286488 A1 | 11/2008 | Li et al. |
| 2008/0305268 A1 | 12/2008 | Norman et al. |
| 2009/0142481 A1 | 6/2009 | Chopra et al. |
| 2009/0286383 A1 | 11/2009 | Jiang et al. |
| 2010/0000762 A1 | 1/2010 | Yang et al. |
| 2010/0035375 A1 | 2/2010 | Grigoropoulos et al. |
| 2011/0043965 A1 | 2/2011 | Yaniv et al. |

FOREIGN PATENT DOCUMENTS

| | | |
|---|---|---|
| CN | 101065203 | 10/2007 |
| CN | 101116149 | 1/2008 |
| EP | 1626106 A2 | 2/2006 |
| EP | 1626106 A3 | 8/2006 |
| EP | 1758166 A2 | 2/2007 |
| EP | 2045028 | 4/2009 |
| EP | 2150417 | 2/2010 |
| EP | 1758166 A3 | 9/2011 |
| JP | 62124084 | 6/1987 |
| JP | 10-308119 | 11/1998 |
| JP | 11-319538 | 11/1999 |
| JP | 2001-325831 | 11/2001 |
| JP | 2003-292836 | 10/2003 |
| JP | 2004-127676 | 4/2004 |
| JP | 2004-273592 | 9/2004 |
| JP | 2005-307335 | 11/2005 |
| JP | 2006-026602 | 2/2006 |
| JP | 2006-169592 | 6/2006 |
| JP | 2006-186330 | 7/2006 |
| JP | 2006-229212 | 8/2006 |
| JP | 2006-321948 | 11/2006 |
| JP | 2007-042725 | 2/2007 |
| JP | 2007-321215 | 12/2007 |
| JP | 2007-327058 | 12/2007 |
| JP | 2007-332347 | 12/2007 |
| JP | 2008006513 | 1/2008 |
| JP | 2009-097082 | 5/2009 |
| WO | 97/08924 | 3/1997 |
| WO | 03/106573 A1 | 12/2003 |
| WO | 2004/005413 A1 | 1/2004 |
| WO | 2006/072959 | 7/2006 |
| WO | 2006/076603 | 7/2006 |
| WO | 2007/004033 | 1/2007 |
| WO | 2007/013393 | 2/2007 |
| WO | 2008/144504 | 11/2008 |
| WO | 2009/111393 | 9/2009 |

OTHER PUBLICATIONS

Lu et al., "Ultrahigh Strength and High Electrical Conductivity in Copper," Science Magazine, Apr. 2004, vol. 304, 6 pages.

Volkman et al., "Ink-jetted Silver/Copper Conductors for printed RFID Applications," Materials Research Society Magazine, 2004, vol. 814, 6 pages.

Wu et al., "One-Step Green Route to Narrowly Dispersed Copper Nanocrystals," Journal of Nanoparticle Research, 2006, pp. 965-969, 5 pages.

Curtis et al., "Spray and Inkjet Printing of Hybrid Nanoparticle-Metal-Organic Inks for Ag and Chu Metallizations," Materials Research Society Magazine, 2001, vol. 676, 6 pages.

Shacham-Diamand, "Electroless Copper Deposition Using Glyoxylic Acid as Reducing Agent for Ultralarge Scale Integration Metallization," manuscript published by Electrochemical and Solid-State Letters, Apr. 2000, pp. 279-282, 4 pages.

Yeshchenko et al., "Size-Dependent Melting of Spherical Copper Nanoparticles," article published by National Tams Shevchenko Kyiv University, Jan. 2007, 16 pages.

Shah et al., "Trimming and Printing of Embedded Resistors Using Demand-Mode Ink-Jet Technology and Conductive Polymer," IPC Printed Circuit Expo Mar. 24-28, 2002, pp. 1-5.

(56) References Cited

OTHER PUBLICATIONS

International Searching Authority, International Search Report and the Written Opinion, PCT/US08/63890, Aug. 6, 2008, 9 pages.
International Searching Authority, International Search Report and Written Opinion for Application No. PCT/US/09/35717, May 5, 2009, 7 pages.
Niizeki et al., "Laser Sintering of Ag Nanopaste Film and Its Application to Bond-Pad Formation," 2008 Electronic Components and Technology Conference, May 27-30, 2008, IEEE, pp. 1745-1750.
Lee et al, "Spontaneous Growth Mechanism of Tin Whsker," Acta mater vol. 46, No. 10, pp. 3701-3714, 1998.
Galyon, "Annotated Tin Whisker Bibliography and Anthology," IEEE Transactions on Electronics Packaging Manufacturing, vol. 28, No. 1, Jan. 2005, pp. 94-122.
Lal et al., "Role of Intrinsic Stresses in the Phenomena of Tin Whiskers in Electrical Connectors," IEEE Transactions on Electronics Packing Manufacturing, vol. 28, No. 1, Jan. 2005, pp. 63-74.
Boettinger et al., "Whisker and Hillock Formation on Sn, Sn—Cu and Sn—Pb Electrodeposits," Acta Materialia, 53, Sep. 8, 2005, pp. 5033-5050.
Mitooka et al., "Effect of Laser Irradiation on Generation Growth of Whiskers in Tin-Electroplated Film," J. Japan Inst. Metals, vol. 73, No. 3, (2009), pp. 226-233.
Osenbach et al., "Sn Corrosion and Its Influence on Whisker Growth," IEEE Transactions on Electronic Packaging Manufacturing, vol. 30, No. 1, Jan. 2007, pp. 23-35.
Osenbach et al., "Sn Whiskers: Material, Design, Processing, and Post-Plate Reflow Effects and Development of an Overall Phenomenological Theory," IEEE Transactions on Electronics Packaging Manufacturing, vol. 28, No. 1, Jan. 2005, pp. 36-62.
Osterman, "Mitigation Strategies for Tin Whiskers," Release 1.0, Aug. 28, 2002, 11 pages.
Schroeder et al., "Tin Whisker Test Method Development," IEEE Transactions Electronics Packaging Manufacturing, vol. 29, No. 4, Oct. 2006, pp. 231-238.
International Searching Authority, International Search Report and Written Opinion for International Application No. PCT/US09/44196, Jun. 30, 2009, 8 pages.
International Searching Authority, International Search Report and Written Opinion for International Application No. PCT/US09/44195, Jun. 25, 2009, 7 pages.
International Preliminary Report on Patentability, International Application No. PCT/US2009/044196, Nov. 25, 2010, 6 pages.
International Preliminary Report on Patentability, International Application No. PCT/US2009/044195, Nov. 25, 2010, 5 pages.
International Searching Authority, International Search Report and Written Opinion for International Application No. PCT/US09/49510, Oct. 19, 2009.
International Preliminary Report on Patentability, PCT/US2008/063890, Dec. 3, 2009.
International Searching Authority, International Search Report and Written Opinion of the International Searching Authority for PCT/US10/28799, May 19, 2010.
International Searching Authority, International Search Report and the Written Opinion for International Application No. PCT/US10/28811, May 18, 2010.
MSDS: Fluorad by 3M, Fluorosurfactant FC-4430, Mar. 2, 2002; www.3m.com/paintsandcoatings, 4 pages.
European Patent Office, Supplemental European Search Report for Application No. EP 09774505, Jun. 29, 2011.
The State Intellectual Property Office of The People's Republic of China, Notice of the First Office Action, Application No. 200880021733.6, Jun. 22, 2011.
European Patent Office, Supplementary European Search Report for Application No. EP08755692, Aug. 6, 2010.
Kogelschatz, "Excimer Lamps: History, Discharge Physics, and Industrial Applications", Proc. SPIE, vol. 5483, 2004, pp. 272-286.
Kim et al., "Cyclic Properties of Si—Cu/Carbon Nanocomposite Anodes for Li-Ion Secondary Batteries", Journal of the Electrochemical Society, vol. 152, No. 3, pp. A-523-A-526, Jan. 24, 2005, retrieved from internet Aug. 26, 2010.
International Searching Authority, International Search Report and the Written Opinion for PCT/US10/042169, mailed on Sep. 7, 2010, 4 pages.
Yaniv, "Novel Inkettable Copper Ink Utilizing Processing Temperatures Under 100 Degrees C Without the Need of Inert Atmosphere", Presentation at Printed Electronics Europe Conference, pp. 1-25, Apr. 7-8, 2009, retrieved from internet Aug. 26, 2010.
The International Bureau of WIPO, International Preliminary Report on Patentability for PCT/US2010/042169, Jan. 17, 2012.
The State Intellectual Property Office of The People's Republic of China, Notice on the First Office Action; Patent Application No. 200980108344.1, Jan. 21, 2012.
European Patent Office, Examination Report, Application No. 08 755 692.4, Apr. 13, 2012.
Champion at al., "Sintering of copper nanopowders under hydrogen: an in situ X-ray diffraction analysis," Materials Science and Engineering A, vol. 360, No. 1-2, Nov. 1, 2003, pp. 258-263.
The State Intellectual Property Office of The People's Republic of China, Notice on Grant of Patent Right for Invention, Application No. 200880021733.6, Apr. 20, 2012.
The State Intellectual Property Office of The People's Republic of China, Notice on the First Office Action, Application No. 200980125925.6, Mar. 31, 2012, 8 pages, CN.
Korean Intellectual Property Office, Chemistry & Biotechnology Examination Bureau, Notice to File a Response, Patent Application No. 10-2010-7022240, May 8, 2012, KR.
Tego 425 Flow Datasheet; http://evonik.tego.de/pdf/daten/amer/Flow_425.pdf.
United States Patent & Trademark Office, Final Office Action Summary, U.S. Appl. No. 12/391,817, dated Aug. 27, 2012.
United States Patent & Trademark Office, Non-Final Office Action Summary, U.S. Appl. No. 12/496,453, dated Jun. 13, 2012.
European Patent Office, Examination Report, Application No. 09774505.3, dated Sep. 26, 2012.
United States Patent & Trademark Office, Non-Final Office Action, U.S. Appl. No. 12/466,306, dated Nov. 7, 2012.
Japanese Patent Office, Non-Final Office Action, Japanese Patent Application No. 2011-509765, Jul. 23, 2013.
The State Intellectual Property Office of The People's Republic of China, Application No. 200980118341.6, Notice on the First Office Action, Feb. 17, 2013.
United States Patent & Trademark Office, Non-Final Office Action, Application No. 13/260,893, Mar. 11, 2013.
Translation of Office Action and Taiwan IPO Search Report, Taiwan Invention Patent Application No. 0977118130, May 31, 2013.
The State Intellectual Property Office of The People's Republic of China, Notice on the Second Office Action and Search Report, Patent Application No. 200980108344.1, Dec. 5, 2012.
Korean Intellectual Property Office, Notice of Reasons for Rejection, Application No. 2010-549783, Dec. 18, 2012.
The State Intellectual Property Office of The People's Republic of China, Notice on the Second Office Action, Application No. 200980125925.6, Feb. 25, 2013, 11 pages, CN.
Translated Text of First Office Action for Application No. 201080015842.4, May 6, 2013, 6 pages, CN.
Non-Final Office Action, Notice of Reasons for Rejection, Japanese Patent Application No. 2012-502281, mailed Jul. 16, 2013,.
The State Intellectual Property Office of The People's Republic of China, Notice on the First Office Action, Application No. 20108002385E8, Jul. 15, 2013, 8 pages, CN.
Translation of Notice of Reasons for Rejection, Japanese Patent Application No. 2011-516873, Oct. 22, 2013.
The State Intellectual Property Office of The People's Republic of China, Notice on the First Office Action, Application No. 201080032626.0, Jun. 28, 2013, 7 pages, CN.
The State Intellectual Property Office of The People's Republic of China, Notice on the Third Office Action, Application No. 200980125925.6, Nov. 5, 2013, 1 page, CN.
Japanese Patent Office, Final Office Action, Notice of Reasons for Rejection, Japanese Patent Application No. 2010-549783, dated Oct. 15, 2013.

(56) References Cited

OTHER PUBLICATIONS

Japanese Patent Office, Non-Final Office Action, Notice of Reasons for Rejection, Japanese Patent Application No. 2012-503530, dated Jan. 21, 2014.
The State Intellectual Property Office of The People's Republic of China, Notice on the Third Office Action; Patent Application No. 200980108344.1, Feb. 27, 2014, English Translation.
The State Intellectual Property Office of The People's Republic of China, Translated text of Notice on the Second Office Action; Patent Application No. 201080015842.4, Mar. 10, 2014.
Japanese Patent Office, Non-Final Office Action, Notice of Reasons for Rejection, Japanese Patent Application No. 2011-516873, dated Mar. 24, 2014.
The State Intellectual Property Office of The People's Republic of China, Notice on the Second Office Action; Patent Application No. 201080023851.8, Apr. 8, 2014, CN.
European Patent Office, European Search Report, Application No. 09747709.5, dated Mar. 12, 2014.
The State Intellectual Property Office of The People's Republic of China, Notice on the Second Office Action; Patent Application No. 201080032626.0, Apr. 16, 2014.
European Patent Office, European Search Report for International Application No. 10756901.4, dated Oct. 10, 2014.
Japanese Patent Office, Decision on Rejection, Japanese Patent Application No. 2011-509765, Sep. 29, 2014.
European Patent Office, European Search Report, Application No. 10759242.0, dated Sep. 3, 2014.
Japanese Patent Office, Final Office Action, Notice of Reasons for Rejection, Japanese Patent Application No. 2010-549783, dated Oct. 14, 2014.
European Patent Office, Examination Report, Application No. 09774505.3, dated Oct. 22, 2014.
Taiwan International Patent & Law Office, Translation of Notice of Office Action and Search Report, Taiwan Invention Patent Application No. 099109236, dated Oct. 23, 2014.
The State Intellectual Property Office of the People's Republic of China, Text of the Third Office Action; Patent Application No. 201080015842.4, Sep. 5, 2014.
Taiwan International Patent & Law Office, Translation of Notice of Office Action and Search Report, Taiwan Invention Patent Application No. 098116219, dated Oct. 15, 2014.
Japanese Patent Office, Final Office Action, Notice of Reasons for Rejection, Japanese Patent Application No. 2012-502281, dated Aug. 11, 2014.

\* cited by examiner

Copper ink on Kapton sample

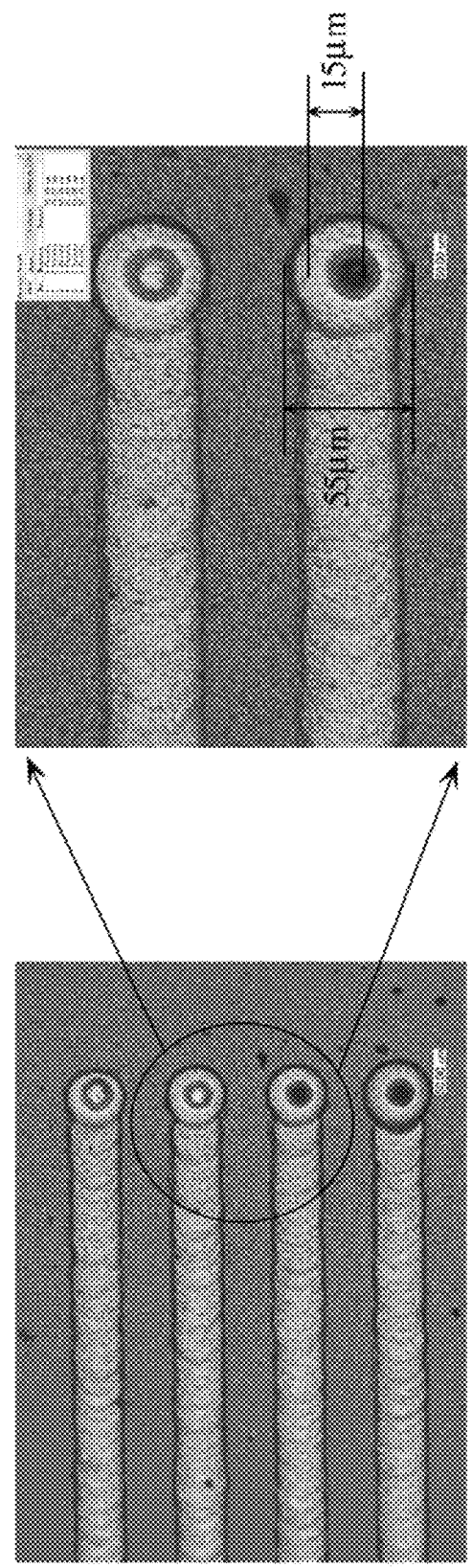

BUFFER LAYER FOR SINTERING

This application is a continuation of U.S. patent application Ser. No. 13/260,893, which claims priority to U.S. Provisional Patent Application Ser. Nos. 61/174,758 and 61/163,894.

BACKGROUND INFORMATION

The microelectronics and semiconductor packaging industries have begun to shift to printable electronics. Electronics circuits comprise a variety of components that are electrically connected to each other. Such electrical connections between different components may be made of conductive metal traces that can be printed on substrates with conductive inks. The inks are processed and sintered after deposition on a substrate in order to become conductive. Thermal sintering uses a high temperature (e.g., ≥250° C. to fuse the nanoparticles in the inks. Photonic (photo) and laser sintering utilize a very high intensity lamp/laser to fuse the nanoparticles in a very short period of time (e.g., microseconds) with a low temperature and so as not to damage the underlying substrates. However, the photo/laser sintering process has limits that require low thermal conductivity material for substrates in order for the nanoparticles to effectively absorb energy and sinter before heat energy dissipates into the substrate. In other words, the substrates that can be used in these applications will be very limited for low thermal conductivity materials.

On the other hand, low thermal conductive substrates can be used for flexible printable electronics. Low temperature melting point materials such as polyethylene (PE), polyester (PET), etc., will prevent the nanoparticle inks from proper sintering, and the substrates will be damaged, with the result that the resistivity will be very high.

BRIEF DESCRIPTION OF THE DRAWINGS

FIG. 4 is a digital photograph showing laser sintered lines on a Kapton substrate.

FIG. 5 is an enlarged digital photograph showing the laser sintered lines of FIG. 4.

DETAILED DESCRIPTION

Figure 1:
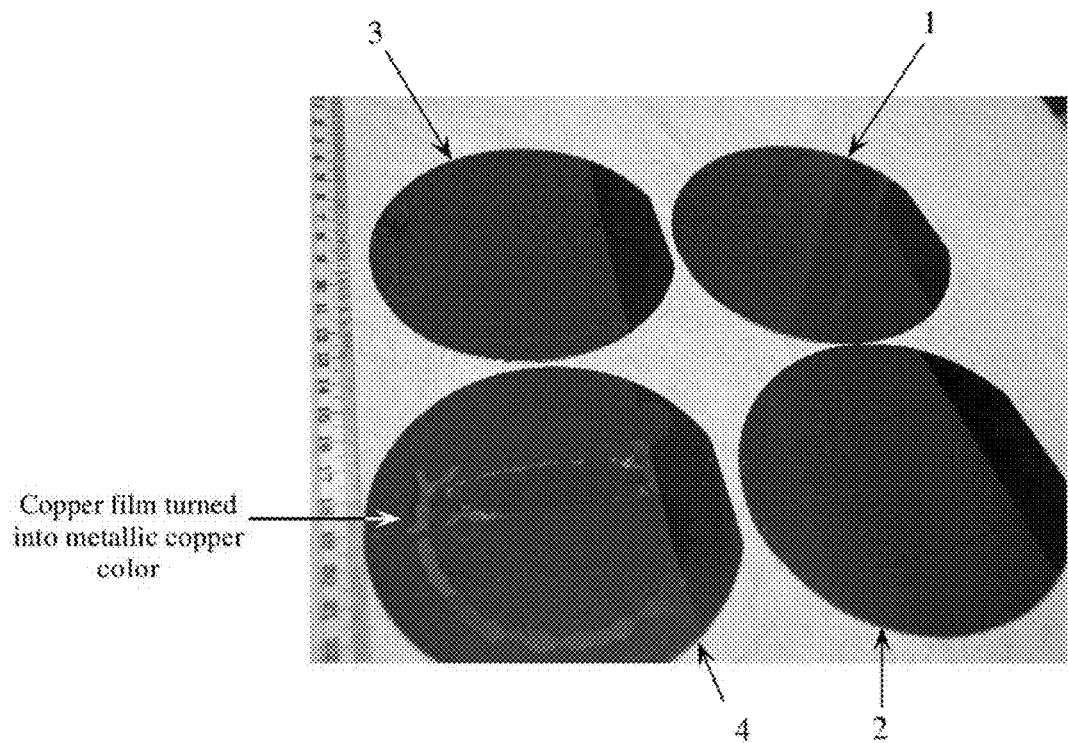
FIG. 1 is a digital photograph showing copper inks photosintered on four silicon wafers.

Embodiments of the present invention disclose a photosintering process to effectively sinter metallic nanoparticles on a polyimide substrate, thus causing the film to be very conductive near the bulk material. On other hand, the photosintering process does not perform well on nanoparticle inks coated on substrates possessing a high thermal conductivity, such as ceramics and silicon wafer. Table 1 shows the thermal conductivity for a variety of materials.

TABLE 1

| item # | material | density (g/cm³) | heat capacity (J/g · K) | heat conductivity (W/m · K) | thermal effusivity | melting point, ° C. degrees |
|---|---|---|---|---|---|---|
| 1 | air | 0.0013 | 1 | 0.025 | 0.00 | NA |
| 2 | paper | 0.33 | 0.73 | 0.030 | 0.01 | NA |
| 3 | Polyimide (kapton) | 1.42 | 1.09 | 0.120 | 0.19 | NA |
| 4 | PMMA (resist) | 1.19 | 1.46 | 0.160 | 0.28 | 180 |
| 5 | PET (Mylar) | 1.23 | 1.13 | 0.176 | 0.24 | 150 |
| 6 | LCP (liquid crystal polymer) | 1.4 | 1.6 | 0.500 | 1.12 | 300 |
| 7 | PE (polyethylene, high density) | 0.95 | 2.3 | 0.500 | 1.09 | 125 |
| 8 | water | 1 | 4.2 | 0.600 | 2.52 | 0 |
| 9 | glass | 2.3 | 0.753 | 1.330 | 2.30 | 950 |
| 10 | $SiO_2$ | 2.2 | 0.75 | 1.380 | 2.28 | 1600 |
| 11 | MgO | 3.2 | 0.84 | 5.900 | 15.86 | 2852 |
| 12 | carbon-amorphous | 1.51 | 0.707 | 6.280 | 6.70 | 3600 |
| 13 | $Si_3N_4$ | 2.8 | 0.69 | 7.950 | 15.36 | 1900 |
| 14 | $TiO_2$ | 4.25 | 0.69 | 9.000 | 26.39 | 1843 |
| 15 | $CuO/Cu_2O$ | 6.5 | 0.536 | 18.000 | 62.71 | 1235 |
| 16 | Ti | 4.5 | 0.523 | 21.000 | 49.42 | 1668 |
| 17 | $Al_2O_3$ (ceramics) | 2.5 | 0.81 | 30.000 | 60.75 | 2054 |
| 18 | solder (60/40 Sn/Pb) | 8.5 | 0.197 | 50.210 | 84.08 | 185 |
| 19 | Ni | 8.9 | 0.444 | 88.000 | 347.74 | 1455 |
| 20 | Mo | 10.2 | 0.25 | 134.000 | 341.70 | 2623 |
| 21 | Si | 2.33 | 0.7 | 148.000 | 241.39 | 1414 |
| 22 | carbon-graphite | 2.25 | 0.707 | 167.360 | 266.23 | 3600 |
| 23 | Al | 2.7 | 0.88 | 209.000 | 496.58 | 660 |
| 24 | Au | 19.3 | 0.13 | 318.000 | 797.86 | 1086 |

TABLE 1-continued

| item # | material | density (g/cm³) | heat capacity (J/g · K) | heat conductivity (W/m · K) | thermal effusivity | melting point, ° C. degrees |
|---|---|---|---|---|---|---|
| 25 | Cu | 8.9 | 0.385 | 398.000 | 1363.75 | 1064 |
| 26 | carbAL | 2.3 | 0.75 | 425.000 | 733.13 | 3600 |
| 27 | Ag | 10.5 | 0.24 | 427.000 | 1076.04 | 962 |
| 28 | carbon-diamond | 3.51 | 0.506 | 543.920 | 966.03 | 3800 |
| 29 | carbon nanotubes | | | 6000.000 | | |

Low conductivity materials, such as polyimide, can be used as a coating material onto other high thermal conductivity substrates, such as ceramics and silicon wafer, in order to isolate heat energy dissipation from nanoparticles during a photosintering process so that the nanoparticles are fused more effectively. How quickly heat dissipates depends on the thickness of the low thermal conductivity material (e.g., polyimide film).

The following experiment was conducted for showing how the present invention operates. Three wafers were spin coated with 1, 1.5, and 2.3 microns thick DuPont PI-2610 polyimide, respectively, and thermal cured at 350° C. for 30 minutes. One bare silicon wafer was used for a reference (wafer #1). All four wafers were coated with copper ink using a drawdown process. After a 60 minute drying process at 100° C., each wafer was divided into three zones that were individually sintered with three different energy levels. The resistance for each zone and each wafer was measured with a voltmeter, with the results shown in Table 2, which shows the electrical resistances of a copper film after photosintering with various coating thicknesses of polyimide on silicon wafers.

TABLE 2

| wafer # | polyimide thickness (μm) | copper ink (μm) | Zone 1: resistance with energy 1 | Zone 2: resistance with energy 2 | Zone 3: resistance with energy 3 |
|---|---|---|---|---|---|
| 1 | 0 | 3.2 | >20 MΩ | >20 MΩ | >20 MΩ |
| 2 | 1 | 3.2 | >20 MΩ | >20 MΩ | >20 MΩ |
| 3 | 1.5 | 3.2 | >20 MΩ | >20 MΩ | >20 MΩ |
| 4 | 2.3 | 3.2 | >20 MΩ | >20 MΩ | 20 Ω | where
energy 1 = 3 sinter shots with 850/1050 V, 1000 μsec
energy 2 = 4 sinter shots with 850/1150 V, 1000 μsec
energy 3 = 5 sinter shots with 850/1250 V, 2000 μsec Except for zone 3 of wafer 4, all zones from the four wafers did not experience a change in resistance after photosintering. Zone 3 of wafer 4 experienced a change in its metallic color at the highest energy level, as shown in FIG. 1. The area had a severe blow off. The surrounding area had copper debris left that was conductive. This is clear evidence that the polyimide material may be used as a thermal insulator. The thickness of polyimide may be more than 3 microns. The thermal conductivity is 0.12 and 148 W/m·K for polyimide and silicon, respectively. The heat dissipated into the silicon substrate (wafer #1) too quickly to sinter the copper nanoparticles since there was no polyimide material.

Wafers 1, 2, and 3 all had high resistance (greater than 20 mega-ohms). Wafer 4 at the center zone with 20 ohms resistance as shown in FIG. 1 appeared that the copper nanoparticles film started to be fused, sintered, and turned into a copper color. The thicker low thermal conductivity material can thus be used as a good thermal insulator.

Figure 2:
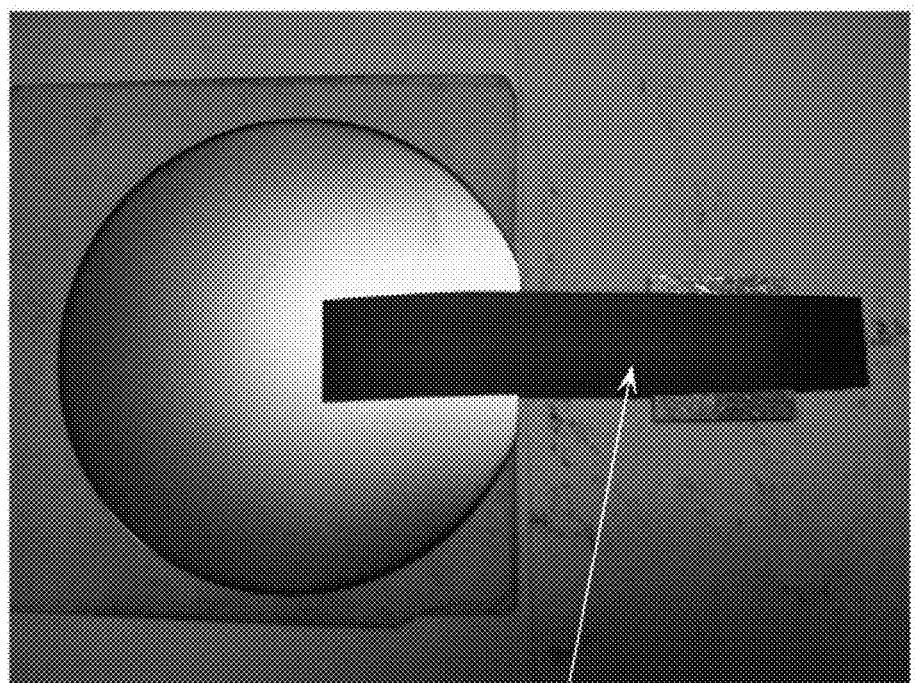
FIG. 2 is a digital photograph showing copper inks before being photosintered.
Figure 3:
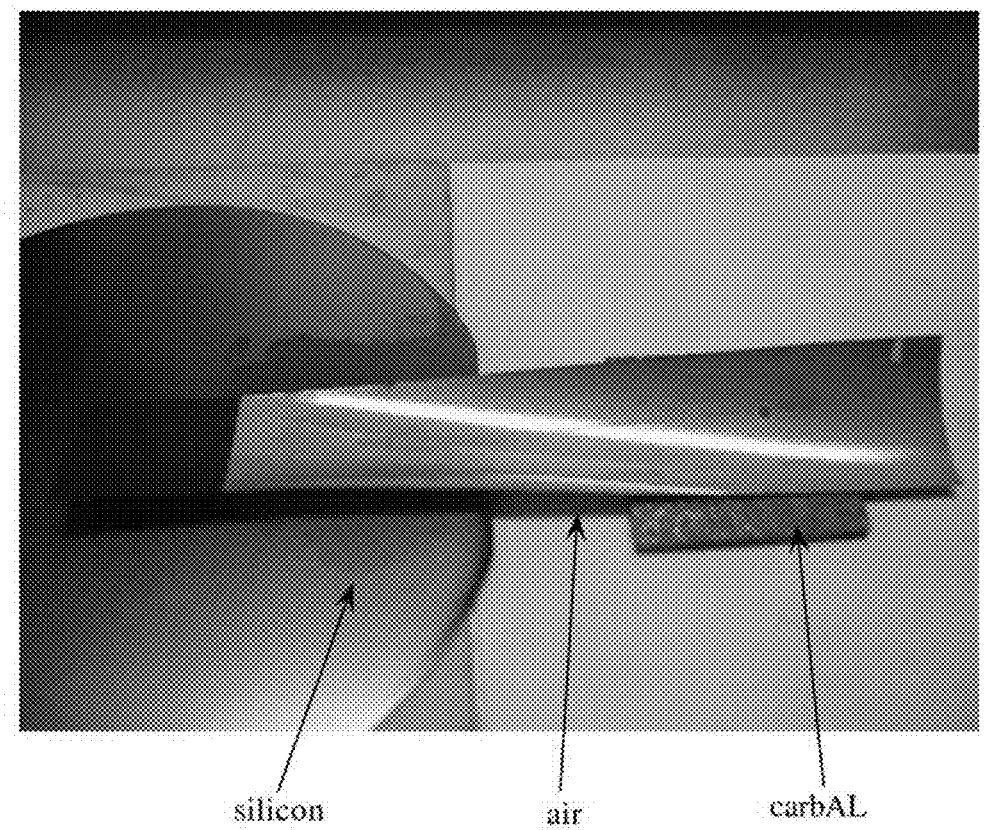
FIG. 3 is a digital photograph showing copper inks after being photosintered.

In addition to the liquid polyimide disclosed above, a dry polyimide film was also utilized. The copper ink was coated on a 50 micron polyimide film (e.g., Kapton). The sample was placed on a silicon wafer and a carbAL high thermal conductive heat sink, as shown in FIG. 2. Silicon grease was coated in between the polyimide film and the silicon wafer and heat sink to ensure good thermal contact. The sample was photosintered simultaneously in a single shot. The copper was sintered very well and turned a shiny copper color, as shown in FIG. 3. It did not matter what materials the polyimide film was residing on. At least a 50 micron thick polyimide film is sufficiently thick to isolate and prevent heat energy dissipation for photosintering processes, though a thickness of less than 50 microns may be utilized for embodiments where less conductivity is desired of the conductive traces.

In addition, laser sintering was utilized on silicon wafers with the same setup as described above. The laser was a solid state diode with an 830 nm wavelength and an 800 mW power. The focus beam size was 15 microns in diameter and controlled by a collimator and an objective lens, as shown in FIGS. 4 and 5.

Figure 6:
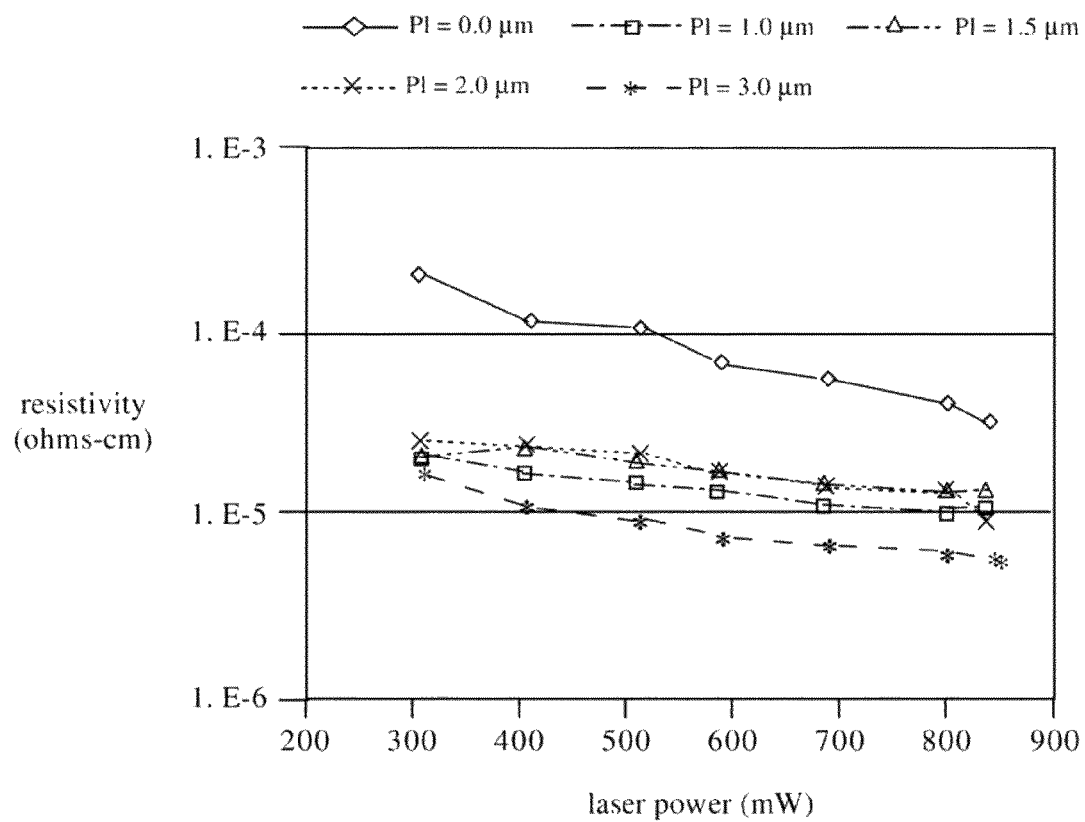
FIG. 6 illustrates a graph showing that copper ink resistivity sintered by a laser is not only inversely proportional to laser power, but also inversely proportional to buffer layer thickness made of polyimide.

This laser had sufficient power to sinter and fuse the nanoparticles and turn the copper ink conductive. There were four silicon wafers coated with various polyimide thicknesses of 1, 1.5, 2, and 3 microns, respectively, along with a bare silicon wafer as a reference. The resistivity of each wafer is plotted with laser power in FIG. 6, which indicates that the copper film conductivity is proportional to the polyimide thickness, and the heat generated by the laser is transferred to the substrate less with polyimide present than the bare silicon wafer without polyimide. This is clear evidence that any material having a low thermal conductivity, such as a polyimide material, may be used as a thermal insulator and enhance the photograph and laser sintering processes.

Furthermore, a variety of polyimide thicknesses were coated on silicon wafers and cured at 350° C. for one hour. Then the standard copper ink was coated by drawdown, dried in an oven, and photo/laser sintered. Electrical measurements were performed and characterized the copper ink samples.

Figure 7:
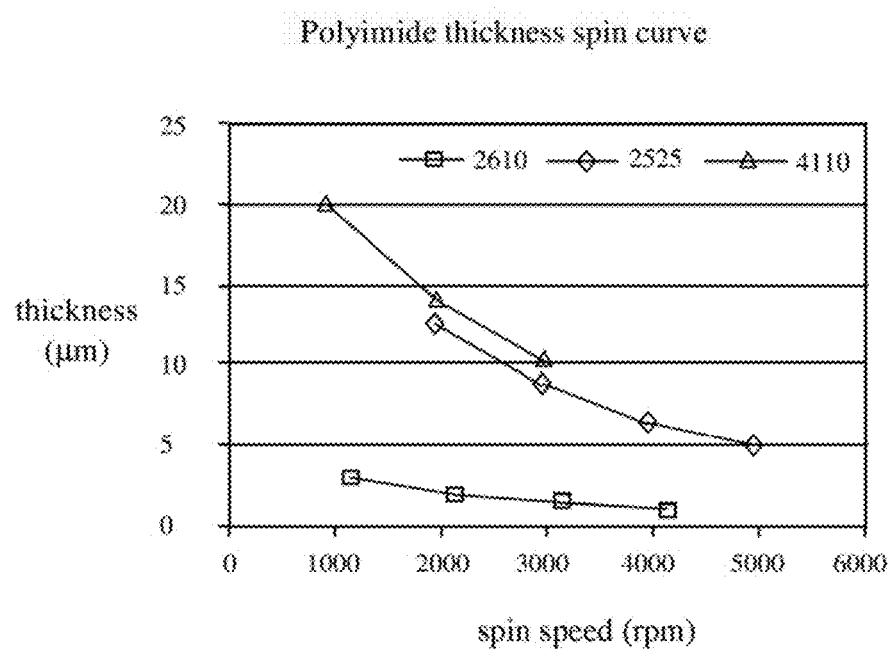
FIG. 7 illustrates a graph showing thicknesses of cured polyimide measured at various spin speeds.

Three types of polyimide material (e.g. made by DuPont) were used to spin coat on silicon wafer at 1000, 2000, 3000, 4000, and 5000 rpm. FIG. 7 illustrates a graph showing thicknesses of cured polyimide measured at various spin speeds. The range was from 1 to 20 microns on each wafer, respectively.

After samples were prepared, both photograph and laser sintering were performed on the copper inks. Different types of sintering were compared versus resistivity and adhesion, as well as line width for laser sintering. Table 3 shows samples photosintered at the same energy level with various thicknesses of polyimide. Table 4 shows samples laser sintered at a fixed power level with various thicknesses of polyimide,

TABLE 3

| sample # | polyimide thickness (μm) | Cu ink thickness (μm) | resistivity (ohm-cm) | adhesion (1-10) |
|---|---|---|---|---|
| 1 | 0 | 3 | $3.00 \times 10^{1}$ | 1 |
| 2 | 5 | 2 | $1.30 \times 10^{-4}$ | 2 |
| 3 | 6.5 | 2 | $4.00 \times 10^{-5}$ | 4 |
| 4 | 8.7 | 2 | $1.60 \times 10^{-5}$ | 7 |
| 5 | 12.5 | 2 | $1.52 \times 10^{-5}$ | 7 |
| 6 | 10 | 1.5 | $1.50 \times 10^{-5}$ | 8 |
| 7 | 14 | 1.5 | $1.40 \times 10^{-5}$ | 8 |
| 8 | 20 | 1.5 | $1.14 \times 10^{-5}$ | 8 |

TABLE 4

| sample # | polyimide thickness (μm) | resistivity (ohm-cm) at 840 mW | adhesion (1-10) | line width (μm) at 840 mW | line width (μm) at 409 mW |
|---|---|---|---|---|---|
| 11 | 0 | $1.60 \times 10^{-4}$ | 1 | 70 | 35 |
| 12 | 1 | $1.26 \times 10^{-5}$ | 5 | 74 | 38 |
| 13 | 1.5 | $1.36 \times 10^{-5}$ | 5 | 77 | 39 |
| 14 | 2 | $9.33 \times 10^{-6}$ | 3 | 83 | 40 |
| 15 | 3 | $6.00 \times 10^{-6}$ | 1 | 88 | 42 |
| 16 | 5 | $4.75 \times 10^{-6}$ | 8 | 92 | 65 |
| 17 | 7 | $4.82 \times 10^{-6}$ | 8 | 103 | 75 |
| 18 | 12 | $3.61 \times 10^{-6}$ | 8 | 150 | 88 |
| 19 | 20 | $5.47 \times 10^{-6}$ | 8 | 180 | 120 |

Figure 8:
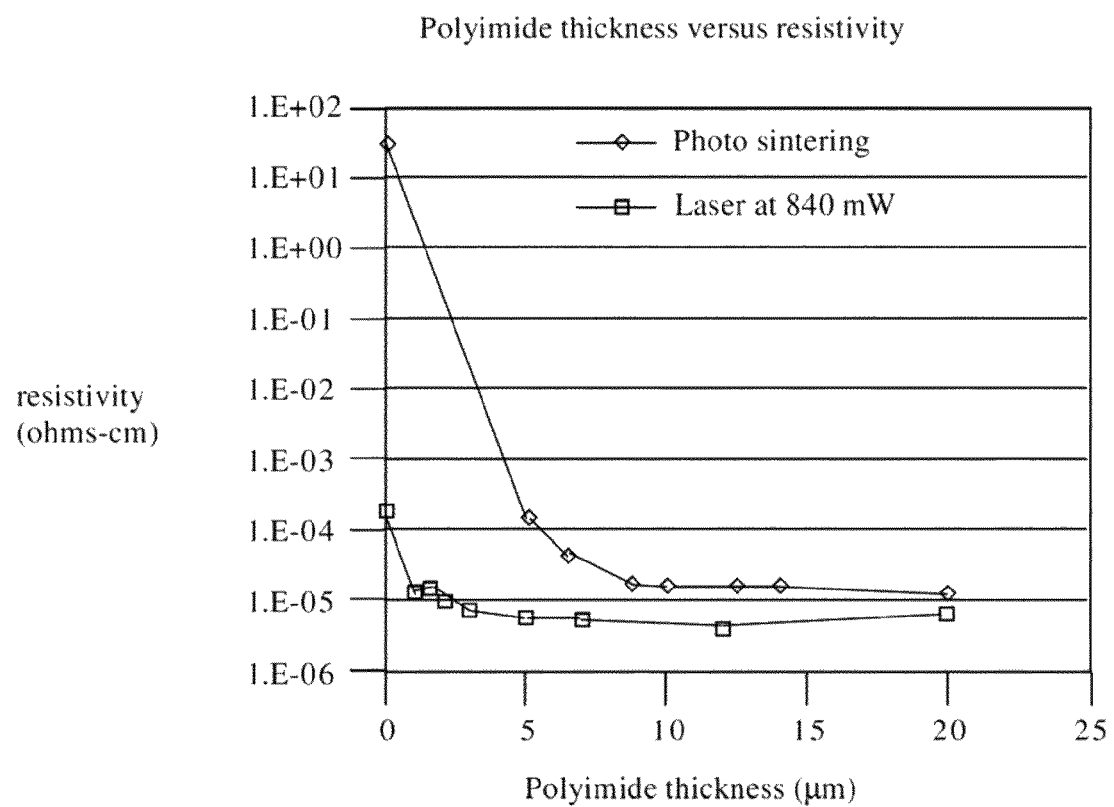
FIG. 8 illustrates a graph showing that resistivity of sintered copper film is inversely proportional to polyimide thickness.

FIG. 8 illustrates a graph showing that resistivity of sintered copper film is inversely proportional to polyimide thickness. The saturated points for resistivity are approximately at 10 microns for photosintering and approximately at 5 microns for laser sintering. Power density of photosintering is much lower than that of laser sintering, providing a reason why its resistivity is higher.

Figure 9:
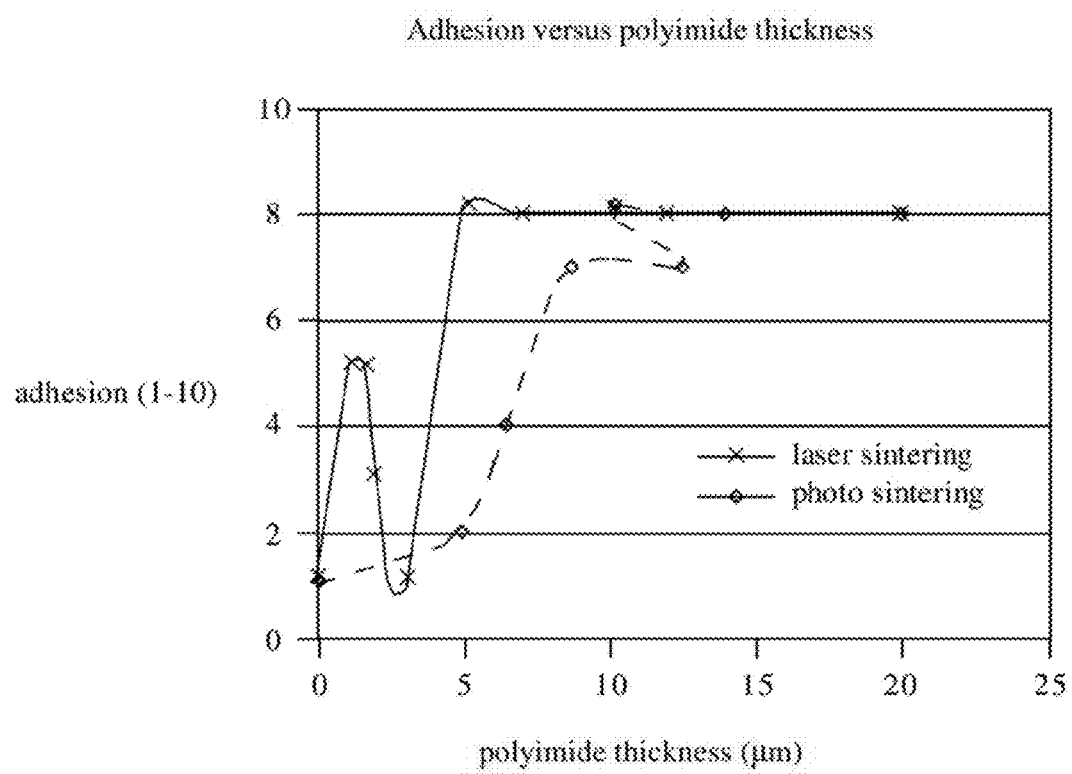
FIG. 9 illustrates a graph showing that adhesion of copper ink film to polyimide is proportional to polyimide thickness.

FIG. 9 illustrates a graph showing that adhesion of copper ink film to polyimide is proportional to polyimide thickness. There are some noise points, but the trend is clear from the graph. The thicker the polyimide is, the better the adhesion is. Again, critical points of polyimide thickness for the good adhesion are approximately at 10 microns for photosintering and approximately at 5 microns for laser sintering.

Figure 10:
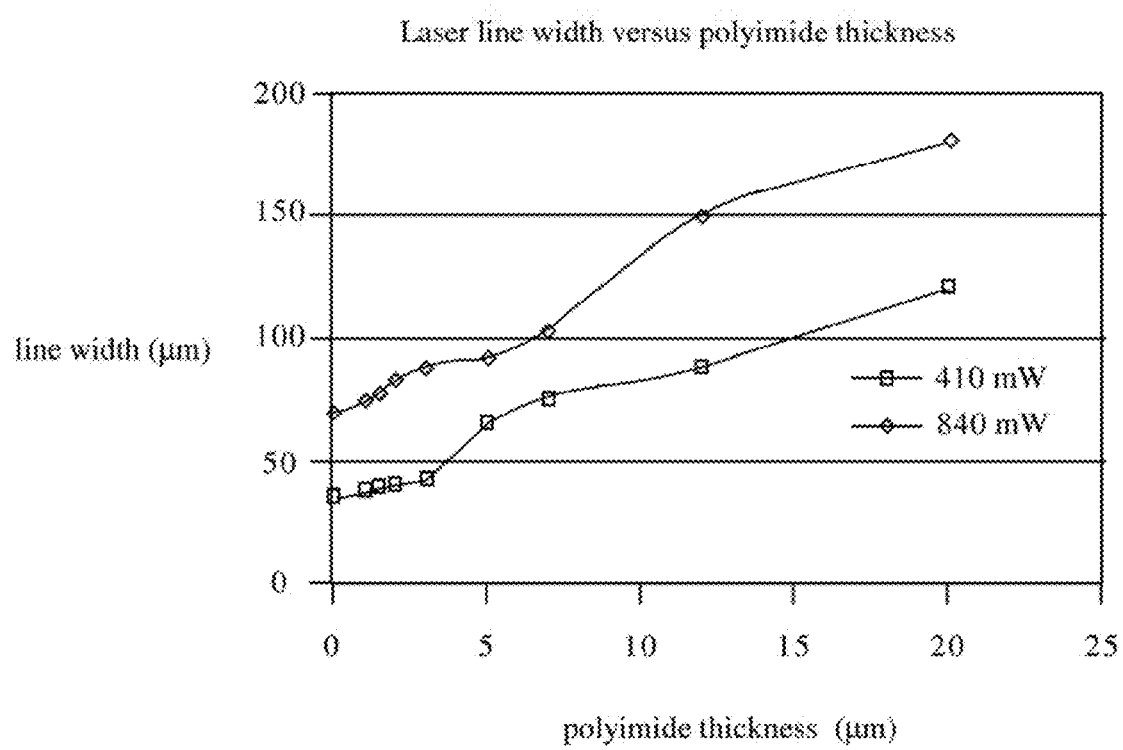
FIG. 10 illustrates a graph showing that laser writing line width is proportional to the laser power density.

FIG. 10 illustrates a graph showing that laser writing line width is proportional to the laser power density. With given laser power, the laser writing line width is also proportional to the polyimide film thickness, providing more evidence that polyimide is a good thermal, insulator for these processes. The laser energy and heat deposited on the copper ink surface could not spread any deeper vertically but laterally while the polyimide thickness increased.

Figure 11A:
FIGS. 11A-11F illustrate a process in accordance with embodiments of the present invention.
Figure 11B:
Figure 11C:
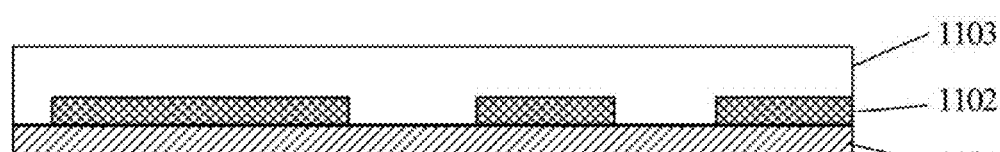
Figure 11D:
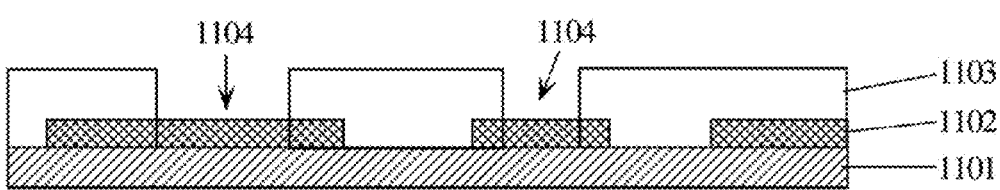
Figure 11E:
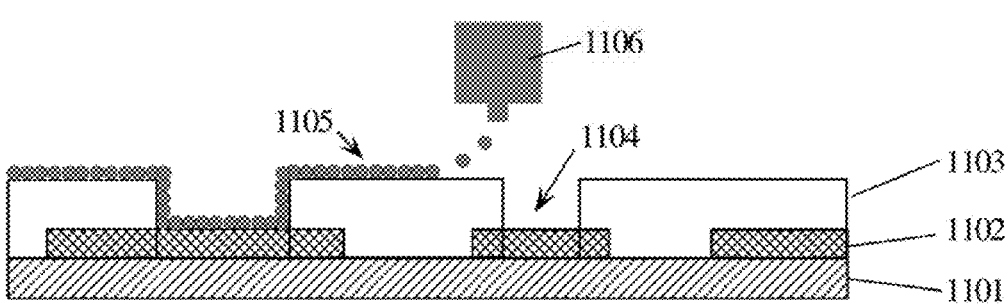
Figure 11F:
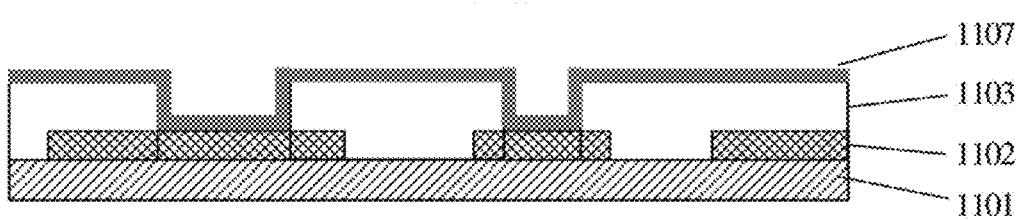

Referring to FIGS. 11A-11F, a process for performing embodiments of the present invention is illustrated. A substrate 1101 is provided on which electronic circuitry is to be mounted. In FIG. 11B, traces of a metal material 1102 are deposited in a desired pattern on the substrate 1101, using a well-known manufacturing process. In FIG. 11C, a layer of low thermal conductivity material 1103, such as polyimide, is coated over the metal traces 1102 and substrate 1101. To create further patterns for the conductive traces to be deposited, vias 1104 are formed through the material 1103, exposing portions of the metal traces 1102. In FIG. 11E, an ink jet apparatus 1106 deposits a conductive ink 1105, such as copper nanoparticles, over the material 1103 and the metal traces 1102 exposed by the vias 1104. In FIG. 11F a photograph or laser sintering process is performed on the deposited conductive ink nanoparticles 1105 to sinter them into conductive traces 1107, as described herein. Depositing of the conductive inks and the sintering processes are described in U.S. Patent Publication No. 2008/0286488 A1, which is hereby incorporated by reference herein.

SUMMARY

1. The effectiveness of a photosintering process depends on not only metallic nanoparticle size, but also the type of substances.

2. Effective photosintering is achieved with nanoparticles below 300 nm.

3. The thermal conductivity of substrates will affect metallic ink photosintering. The lower the thermal conductivity of the substrate, the better the electrical conductivity of the nanoparticle film.

4. High thermal conductive substrates can be tailored and isolated by coating low thermal conductivity material, such as polyimide or polymer, for an effective photosintering process.

5. The thickness of coating of polyimide required to isolate thermal heat dissipation is approximately 1-50 microns.

6. The copper ink becoming a conductive film has been demonstrated on high thermal conductive material such as silicon wafer with both laser and photosintering.

7. Heat dissipation on high thermal conductive silicon wafers has been shown with a variety of polyimide thicknesses coated on a wafer. A low thermal conductive material can be used as a buffer layer to slow down heat dissipation and enhance the photograph or laser sintering.

8. Copper ink may be sintered well with polyimide coated on a silicon wafer with resistivity at $1 \times 10^{-5}$ ohm-cm by photosintering and $4 \times 10^{-6}$ ohm-cm by laser sintering.

9. The polyimide material may be not only utilized as a heat insulator on high thermal conductive substrates and enhance copper ink photograph and laser sintering effectiveness, but also applied to low melting temperature substrates as a heat insulator to protect from heat damage during a sintering process.

10. Polyimide layer and metal trace layer can be repeated several times as multilayer circuits.

11. Polyimide layer can be used as a dielectric material and incorporated as capacitors.

12. Nano-copper ink can be used at top layer conductor as a contact metal in two-dimensional and three-dimensional chip packaging applications.

What is claimed is:

1. A method comprising:
   coating a layer of material having a low thermal conductivity over a substrate;
   depositing a film of conductive ink over the layer of material having the low thermal conductivity; and
   sintering the film of conductive ink.

2. The method as recited in claim 1, further comprising:
   depositing a metal layer in a pattern on the substrate, wherein the layer of material having the low thermal conductivity is coated over the patterned metal layer and the substrate; and forming a via through the layer of material having the low thermal conductivity thereby exposing a portion of the patterned metal layer, wherein the depositing of the film of conductive ink includes depositing the film of conductive ink into the via to thereby coat the portion of the patterned metal layer with the film of conductive ink, wherein the film of conductive ink coating the portion of the patterned metal layer is also sintered.

3. The method as recited in claim 1, wherein the substrate has a thermal conductivity greater than the layer of material having the low thermal conductivity.

4. The method as recited in claim 2, wherein the film of conductive ink coated over the portion of the patterned metal layer does not dissipate as much energy from the sintering as the film of conductive ink coated over the layer of material having the low thermal conductivity.

5. The method as recited in claim 4, wherein the layer of material having the low thermal conductivity comprises a polymer.

6. The method as recited in claim 4, wherein the layer of material having the low thermal conductivity comprises polyimide.

7. The method as recited in claim 6, wherein the polyimide has a thickness of at least 50 microns.

8. The method as recited in claim 6, wherein the sintering is performed with a photosintering apparatus.

9. The method as recited in claim 6, wherein the sintering is performed with a laser sintering apparatus.

10. The method as recited in claim 6, wherein the substrate comprises silicon.

11. The method as recited in claim 6, wherein the substrate comprises a ceramic.

12. The method as recited in claim 6, wherein the film of conductive ink comprises copper nanoparticles.

13. The method as recited in claim 6, wherein the polyimide has a thickness of at least 5 microns.

14. The method as recited in claim 6, wherein the polyimide has a thickness of at least 2.3 microns.

15. The method as recited in claim 9, wherein the laser sintering apparatus comprises a solid state diode with an 830 nm wavelength and 800 mW power.

16. The method as recited in claim 15, wherein the solid state diode has a focus beam size of 15 microns in diameter.

17. A method comprising:
coating a layer of material having a low thermal conductivity as a buffer layer over a substrate;
depositing a film of conductive ink over the layer of material having the low thermal conductivity; and
photonic or laser sintering the film of conductive ink with a photo or laser sintering apparatus.

18. The method as recited in claim 17, further comprising:
depositing a metal layer in a pattern on the substrate, wherein the layer of material having the low thermal conductivity is coated over the patterned metal layer and the substrate; and
forming a via through the layer of material having the low thermal conductivity thereby exposing a portion of the patterned metal layer, wherein the depositing of the film of conductive ink includes depositing the film of conductive ink into the via to thereby coat the portion of the patterned metal layer with the film of conductive ink, wherein the film of conductive ink coating the portion of the patterned metal layer is also sintered.

19. The method as recited in claim 17, wherein the layer of material having the low thermal conductivity comprises a polymer or polyimide, wherein the substrate has a thermal conductivity greater than the layer of material having the low thermal conductivity.

20. The method as recited in claim 18, wherein the film of conductive ink coated over the portion of the patterned metal layer does not dissipate as much energy from the sintering as the film of conductive ink coated over the layer of material having the low thermal conductivity.

* * * * *